(12) United States Patent
Weigel

(10) Patent No.: US 6,359,577 B1
(45) Date of Patent: Mar. 19, 2002

(54) MULTIPLE DIGITAL-TO-ANALOG SYSTEM WITH ANALOG INTERPOLATION

(75) Inventor: Ralf Weigel, Künzelsau (DE)

(73) Assignee: GTE Gesellschaft fur Technische Entwicklungen GmbH, Ingelfingen-Lipfersberg (DE)

( * ) Notice: Subject to any disclaimer, the term of this patent is extended or adjusted under 35 U.S.C. 154(b) by 0 days.

(21) Appl. No.: 09/657,480

(22) Filed: Sep. 7, 2000

Related U.S. Application Data

(63) Continuation of application No. PCT/DE99/00507, filed on Feb. 18, 1999.

(30) Foreign Application Priority Data

Mar. 7, 1998 (DE) .......................................... 198 09 882

(51) Int. Cl.[7] .............................................. H03M 1/66
(52) U.S. Cl. ...................................... 341/147; 341/141
(58) Field of Search ................................ 341/141, 144, 341/147

(56) References Cited

U.S. PATENT DOCUMENTS

| | | | |
|---|---|---|---|
| 3,754,236 A | * 8/1973 | Dotson, Jr. ................. | 341/144 |
| 4,238,831 A | * 12/1980 | Pulyer ........................ | 341/144 |
| 5,521,946 A | 5/1996 | Main | |
| 5,537,113 A | * 7/1996 | Kawabata ................... | 341/141 |
| 5,627,538 A | * 5/1997 | Ferry .......................... | 341/144 |
| 5,880,689 A | * 3/1999 | Kushner ..................... | 341/144 |

OTHER PUBLICATIONS

Robert Adams, "DACs ICs: How Many Bits Is Enough?", *Analog Devices*, pp. 189–192 (Feb. 20, 1991).

Larry Gaddy and Hajima Kawai, "Dynamic Performance Testing Of Digital Audio D/A Converters", *Burr–Brown Application Bulletin*, pp. 1–8 (May 1997).

Philips, General Information CD–ROM, "The Compact Disc. How Does It Work?", pp. 1–18 (Apr. 11, 1997).

Nav S. Sooch, et al., "18–Bit Sterio D/A Converter With Integrated Digital And Analog Filters", *Crystal Sooch CS4328 AES Paper*, pp. 67–78 (Oct. 1991).

Malcolm Omar Hawksford, "Digital–to–Analog Converter With Low Intersample Transition Distortion and Low Sensitivity to Sample Jitter and Transresistance Amplifier Slew Rate", *J. Audio Eng. Soc.*, vol. 42. No. 11, pp. 901–917 (Nov. 1994).

David F. Hoeschele, Jr., "Analog–To–Digital and Digital–To–Analog Conversion Techniques", A Wiley–Interscience Publication pp. 197–201 (with 10 sheets of drawings), (Second Edition—1994).

* cited by examiner

*Primary Examiner*—Howard L. Williams
(74) *Attorney, Agent, or Firm*—Darby & Darby

(57) ABSTRACT

An apparatus for signal processing discrete-time values for signal-sampling systems, such as digital/analog converters, switched capacitor filters, direct digital synthesizers, sample-and-hold circuits and the like, having means for producing discrete-time values and means for processing discrete-time values into analog values, is distinguished in that at least one group of at least two signal-sampling systems, which, in particular, have the same input signals applied to them, is of parallel-connected design, means are provided for producing sampling frequencies with a shifted phase angle and for driving the respective sampling system with a shifted phase angle for the particular frequency produced, means are provided for summing the signals from the signal-sampling systems, and means are provided for further processing/converting the summed signals from the sampling systems into analog signals.

11 Claims, 12 Drawing Sheets

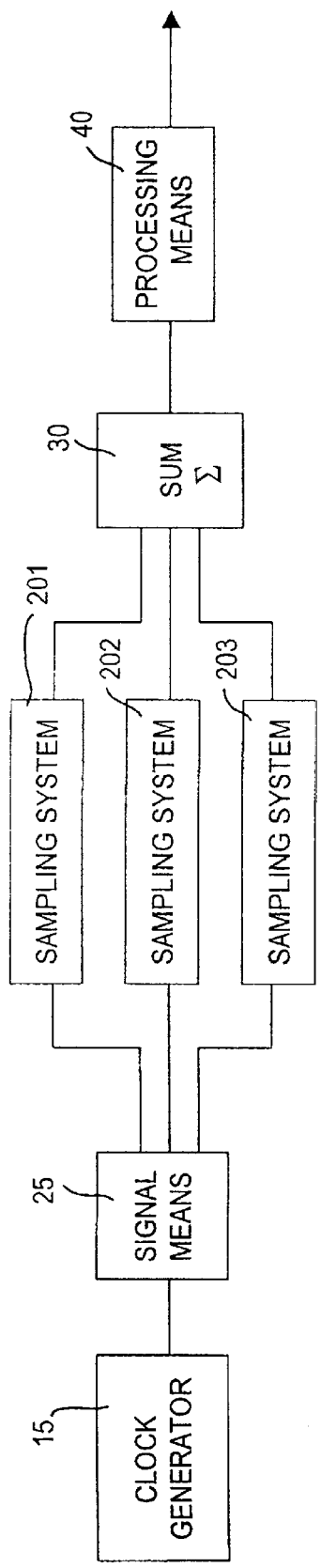
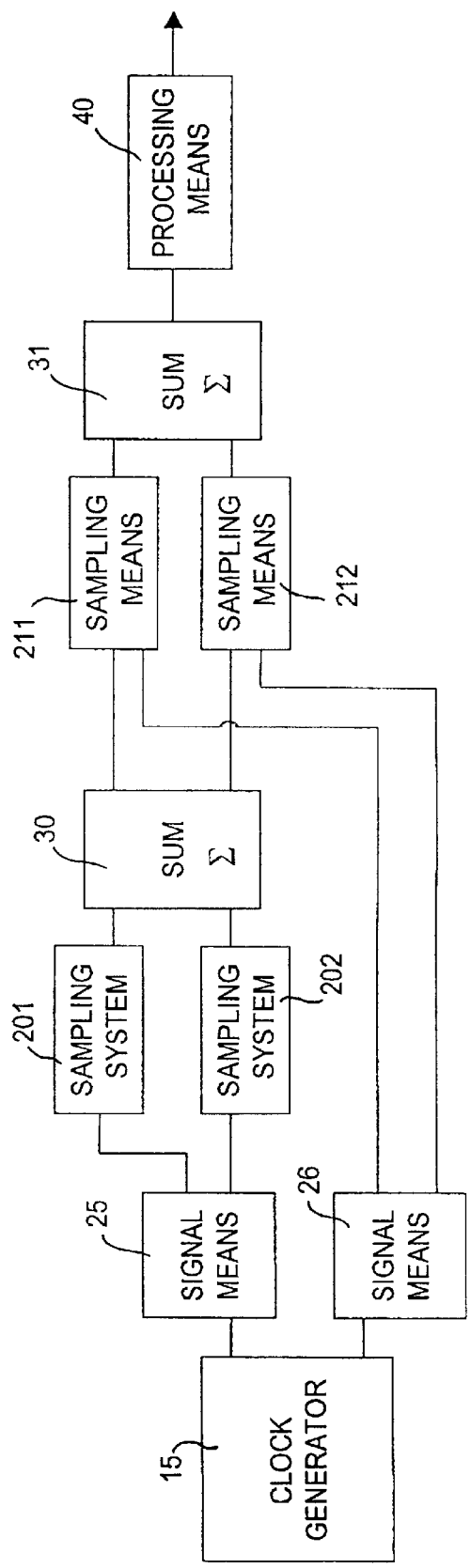
FIG. 13
FIG. 14

MULTIPLE DIGITAL-TO-ANALOG SYSTEM WITH ANALOG INTERPOLATION

This is a continuation of International Application Serial No. PCT/DE99/00507, filed Feb. 18, 1999, the entire disclosure of which is incorporated herein by reference.

FIELD OF THE INVENTION

The present invention relates to an apparatus for signal processing discrete-time values for signal-sampling systems having means, such as digital/analog converters, switched capacitor filters, direct digital synthesizers, sample-and-hold circuits and the like, which deliver an analog discrete-time output signal, having means for producing discrete-time values, which are supplied to the means delivering an analog discrete-time output signal, at least one group of at least two parallel-connected signal-sampling means, means for producing sampling signals at the same frequency, summation means which sum the output signals from the signal-sampling means.

PRIOR ART

It is known that sampling systems can output particular values only at particular times. This means that the output signal for such a system is similar to a staircase and thus also contains spectral components of the sampling frequency in addition to the useful information. These spectral components are suppressed by a time-continuous filter so that no convolution products are produced from the useful signal and the sampling frequency.

Problems arise in known digital/analog (DA) converters. Such problems are easily explained using a compact disk (CD) player. The simplified block diagram of the reproduction electronics of a first generation CD player is illustrated in FIG. 2. The reproduction electronics 50 deliver a digital data stream at 16 bits per clock pulse. The sampling frequency is 44.1 kHz. Since the audio band ranges from 20 Hz to 20 kHz, it is possible, in accordance with the sampling theorem, to restore the original information using a digital/analog converter 52 clocked at 44.1 kHz and using a downstream analog anti-aliasing filter 54 which suppresses convolution products. This filter 54 has two fundamental requirements to fulfil. It needs to have a smooth frequency response in the useful range and needs to have an attenuation of more than 60 dB at half the sampling rate of 22.05 kHz, in order to suppress undesirable aliasing products. Such requirements are met only using complicated 13th order filters 54.

Another solution came to light with the improvement of DA converter technology. The second generation used a 2-fold to 4-fold oversampling rate. FIG. 3 is a schematic illustration of a block diagram of the reproduction electronics of second generation CD players. For this, special digital filters inside the reproduction electronics 56—so-called FIR filters (Finite Impulse Response Filter)—were used to calculate intermediate values, which were additionally output to the DA converter 58. This increased the sampling rate from 44.1 kHz to 88.2 kHz or 176.4 kHz. However, in addition to the increased sampling frequency, the DA converter 58 also needed to be even more accurate, namely 20 bits. The requirements to be more accurate and faster actually conflict with one another. The advantage obtained at the price of this cost-intensive solution is that the analog filter is simplified because the 60 dB attenuation need be achieved only at half the clock rate 44.1 kHz or 88.2 kHz. With 4-fold oversampling, the number of necessary poles in the filter 60 is reduced to 5. In the case of 16-fold oversampling, which is possible today, second order filters are in fact adequate.

Switched capacitor filters are likewise sampling systems, which means that the same problems arise in this case. Active time-continuous filters require resistors and capacitors in addition to the active element (e.g. operational amplifiers). In switched capacitor filters, the resistors are replaced by switched capacitors. There is a linear relationship between the switching frequency and the equivalent admittance. Typical sampling frequencies of integrated SC filters are 50 to 100 times the cutoff frequency. This means that the output signal is composed of 50 to 100 analog discrete-time values. This staircase-like profile thus also contains spectral components of the switching frequency. These can be suppressed by a filter downstream. If this filter is intended to be made tunable by varying the sampling frequency, a range of two decades can thus be implemented. If, by way of example, it is desirable to produce a low-pass filter covering the audio range, then the range to be tuned extends over three decades from 20 Hz to 20 kHz. This would mean that the analog smoothing filter would likewise have to be designed so that it can be tuned or switched over, because, if this filter has a cutoff frequency of 20 Hz, it generates a frequency component, depending on the system, of 2 kHz with an amplitude of around −40 dB (1/100) below the useful signal.

Further prior art relating to DA converters and SC filters can be found in the following publications:

Paul Horowitz, The Art of Electronics, Cambridge University Press, Cambridge 1990, Robert Adams, DAC ICs: How Many Bits is Enough?, Sound and Video Contractor, Feb. 20, 1991, pages 8–189 to 8–192, Larry Gaddy and Hajima Kawai, DYNAMIC PERFORMANCE TESTING OF DIGITAL AUDIO D/A CONVERTERS, APPLICATION BULLETIN, Burr-Brown Corporation, 1997, Helmuth Lemme, Filtern ohne zu rechnen [Filtering without calculation], Elektronik November 1997, pages 96 to 104, Internet address: http://www.km.philips.com/osc/cdrom/geninfo/geninf_1.html, Nov. 4, 1997, pages 1 to 18, Nav S. Sooch et al., 18-BIT STEREO D/A CONVERTER WITH INTEGRATED DIGITAL AND ANALOG FILTERS, Sooch CS4328 AES Paper, New York, October 1991, Digital-to-Analog Converter with Low Intersample Transistion [sic] Distortion and Low Sensitivity to Sample Jitter and Transresistance Amplifier Slew Rate, in Audio Engineering Society, Vol. 42, No. 11, 1994 November, Section 6.11 Glitchless DACs, in the book Analog-to-Digital and Digital-to-Analog Conversion Techniques, by David F. Hoeschele Second Edition Wiley-Interscience 1994 ISBN 0-471-57147-4.

U.S. Pat. No. 5,521,946 discloses an apparatus for signal processing discrete-time values of the type mentioned in the introduction. In this apparatus, a plurality of DA converters are connected in parallel and have different values applied to them. The same input signals are supplied to different digital filters which, in turn, produce different digital output values representing the different input signals for the DA converters. After conversion into analog signals, summation is carried out in the analog domain.

BACKGROUND OF THE INVENTION

The present invention is based on the object or the technical problem of specifying, on the basis of the aforementioned prior art, an apparatus for signal processing discrete-time values of the type mentioned in the introduction which enables the number of intermediate values in sampling systems to be increased without altering the accuracy or the sampling rate of the sampling system.

The apparatus according to the present invention generally comprises an apparatus for signal processing discrete-time values for signal-sampling systems having means, such as digital/analog converters, switched capacitor filters, direct digital synthesizers, sample-and-hold circuits and the like, which deliver, an analog discrete-time output signal, having means for producing discrete-time values, which are supplied to the means delivering an analog discrete-time output signal. The apparatus also includes at least one group of at least two parallel-connected signal-sampling means and also means for producing sampling signals at the same frequency. In addition, summation means are provided which sum the output signals from the signal-sampling means.

Accordingly, the apparatus according to the invention for signal processing discrete-time values is distinguished in that, in the at least one group of at least two signal-sampling parallel-connected means, signal sampling is in each case carried out on the input signal, which is identical in terms of magnitude, and the respective sampling means is driven by the means for producing sampling signals at the same frequency using a shifted phase angle for the sampling signals, the result of which is that, for each input signal, a plurality of analog output signals are produced which are identical but phase-shifted on the basis of the number of parallel-connected signal-sampling means, the summation of said output signals representing interpolation in the analog domain.

One particularly preferred refinement is distinguished in that the number of parallel-connected sampling means is equivalent to the number of frequencies produced with a shifted phase angle.

One particularly preferred refinement of the apparatus according to the invention is distinguished in that the phase differences of the sampling frequencies with a shifted phase angle are identical, that is to say that n sampling signals each phase-shifted through 360°/n are produced, where n corresponds to the number of parallel-connected sampling means, that is to say that linear interpolation is possible.

One alternative refinement is distinguished in that, in the case of sampling signals at the same frequency, the phase differences of the sampling frequencies with a shifted phase angle are different. This enables nonlinear interpolation to be implemented, which makes it possible, by way of example, for ranges with a particularly high level of accuracy or other, for example singular, ranges to be reliably depicted.

One advantageous development is characterized in that the means sampling with a different phase angle are split into two groups which have the uninverted input signal and the inverted input signal applied to them, respectively, and the summing means sums the uninverted signals and deducts the inverted signals.

One particularly preferred development is distinguished in that at least two sampling means are identical.

One particularly advantageous refinement is distinguished in that a plurality of groups of systems which are to be sampled are provided, each group being driven using different sampling frequencies with a shifted phase angle. This means that, as an alternative, the further processing of the signals can preferably be devised such that the signals from the plurality of groups of sampling means are supplied to a summing means, or can preferably be devised such that the summed signals from the first group of sampling means are supplied to a second group of sampling means, which, in turn, are driven using sampling frequencies with a shifted phase angle and whose signals are supplied to further summing means.

A further preferred refinement of the apparatus according to the invention is distinguished in that a plurality of groups of means which are to be sampled are provided, each group being driven using identical sampling frequencies with a shifted phase angle.

Further embodiments and advantages of the invention are revealed by the additional features set out in the claims and by the illustrative embodiments specified below. The features of the claims can be combined with one another in any desired manner, provided that they are not obviously mutually exclusive.

BRIEF DESCRIPTION OF THE DRAWING

The invention and advantageous embodiments and developments thereof are described and explained in more detail below with the aid of the examples illustrated in the drawing. The features found in the description and in the drawing can be applied, according to the invention, individually on their own or together in any desired combination. In the drawing:

FIGS. 13, 14, 15 show schematic illustrations of an apparatus having differently connected groups of parallel systems.

METHODS OF IMPLEMENTING THE INVENTION

Figure 1:
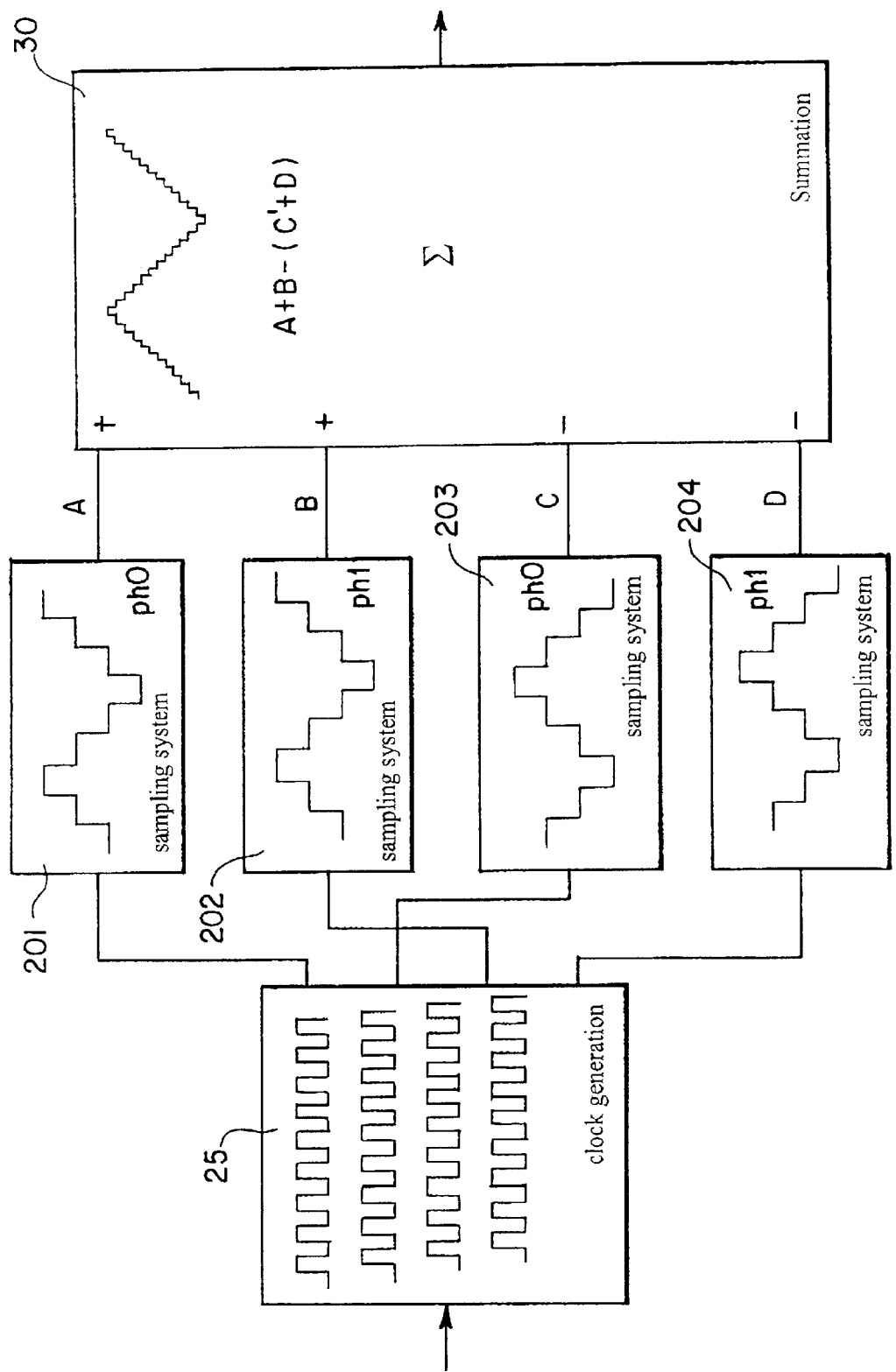
FIG. 1 is a schematic illustration of part of an apparatus having four sampling means, driven using frequencies which a re arranged so as to be shifted in terms of phase, for generating a delta voltage waveform.
Figure 2:
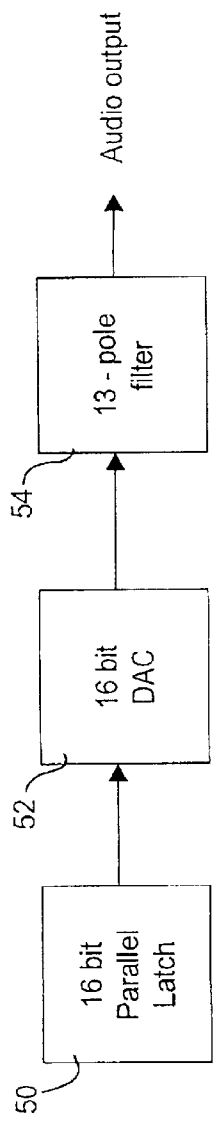
FIG. 2 shows a simplified block diagram of the reproduction electronics of a known first generation CD player.
Figure 3:
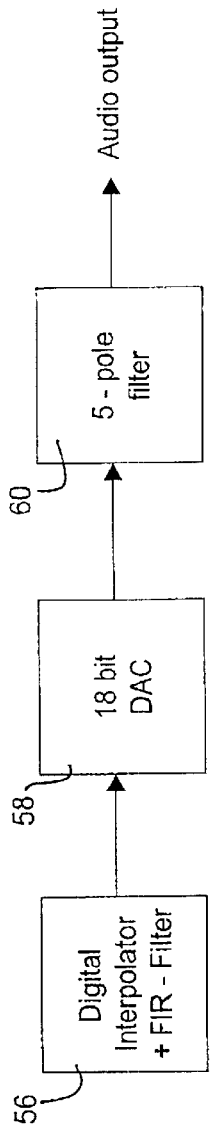
FIG. 3 shows a simplified block diagram of the reproduction electronics of a known second generation CD player.

FIG. 13 is a schematic illustration of part of a block diagram of an apparatus for signal processing discrete-time values, as may be used within an audio system, for example. It shows a clock generator 15, which provides the so-called master clock signal. Connected downstream of the generator 15 are means 25 for generating clock signals which, in turn, apply their output signals to sampling means 20.1, 20.2, 20.3 etc. connected in parallel downstream. The output signals from the sampling means 20 are supplied to summing means 30, and the summed signal is in turn supplied to means 40 for further processing/converting the signals, these means possibly being a commercially available analog filter, for example, suppressing frequencies in the range above 20 kHz.

The means 25 for producing sampling frequencies produce a succession of frequencies for each sampling system connected in parallel downstream, said frequency successions having a prescribed mutual phase shift.

That schematic block diagram of an apparatus for signal processing discrete-time values which is illustrated in FIG. 14 has the components of the apparatus shown in FIG. 13 and also second means 26 for producing sampling frequencies with a shifted phase, these second means 26 applying signals to a second group of sampling means 21.1, 21.2, ..., and these sampling means 21 being supplied with the summed signals from the sampling means 20. In turn, the sampling means 21 forward their signals to second summing means 31, which then supply the signals to further means 40 for further processing/converting purposes, as already mentioned above.

Figure 15:
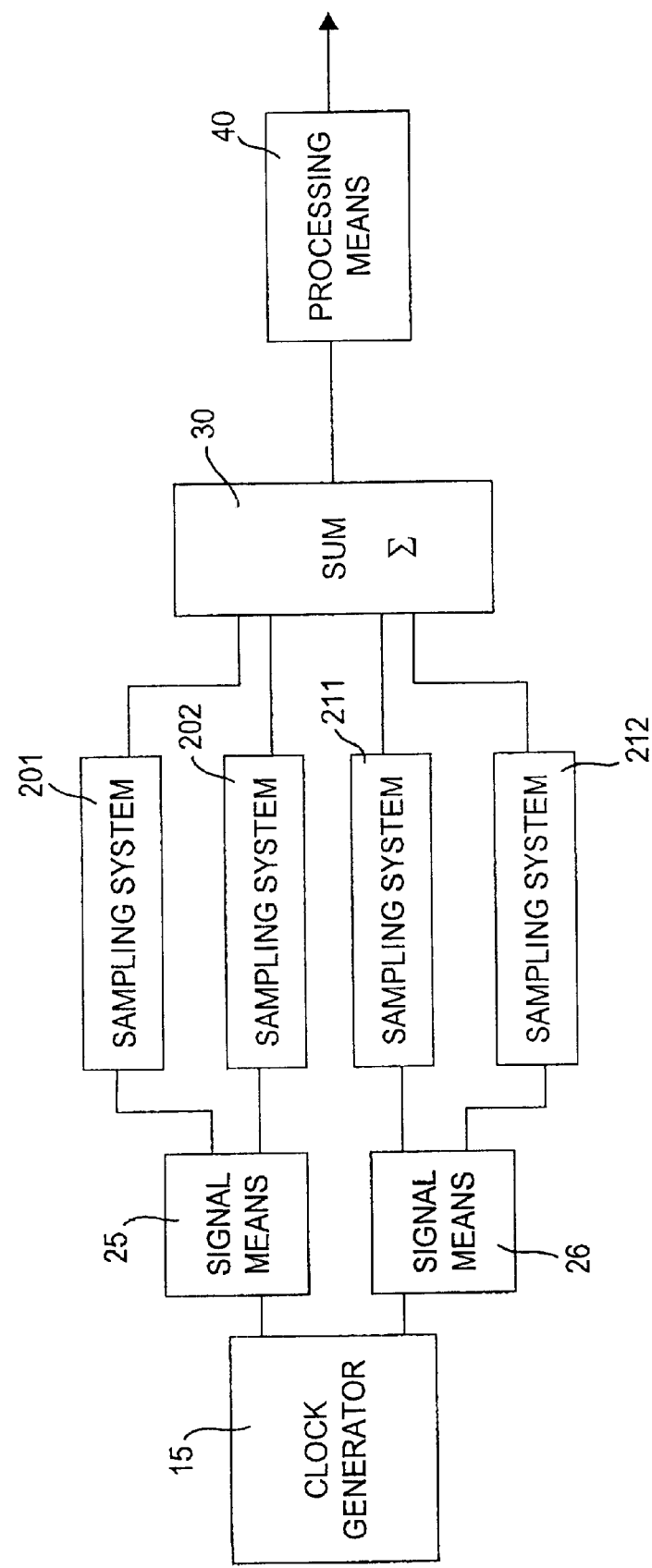
Figure 16:
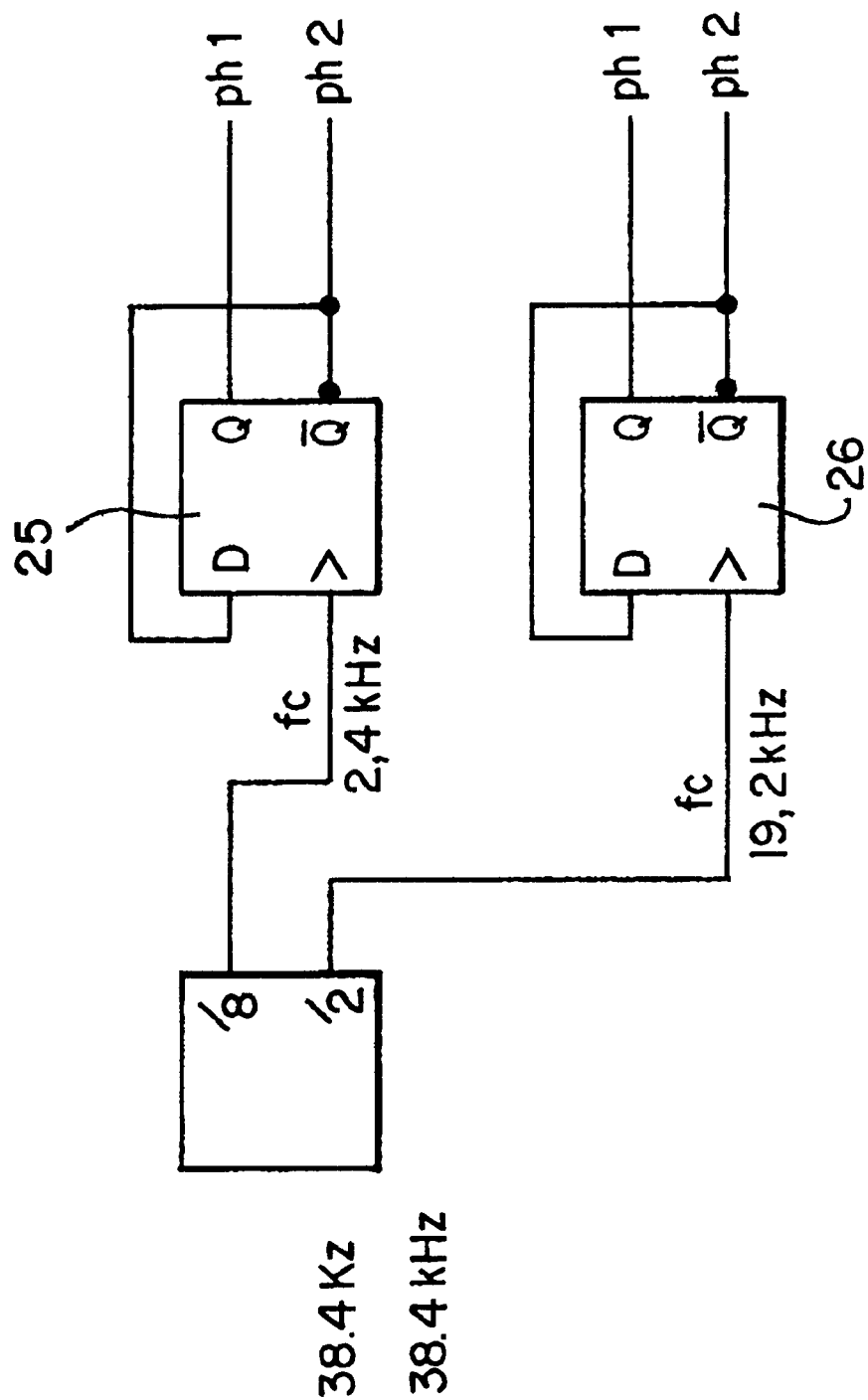
FIG. 16 shows, schematically, part of a circuit diagram of the apparatus shown in FIG. 4.

The apparatus shown in FIG. 15 has a similar design to that of the apparatus shown in FIG. 13, but in this case second means 26 are provided for producing a sampling frequency with a phase shift, said second means applying signals to further means 21 connected in parallel with the sampling means 20, the output signals from the sampling means 20 and from the sampling means 21 being supplied together to summing means 30.

It is also possible for a plurality of groups of means which are to be sampled to have the same group of phase-shifted clock signals supplied to them in each case.

FIG. 1 shows an arrangement in which sampling means have input signals which are shifted through 180° applied to them in some cases. The symmetrical arrangement illustrated has the additional advantage that the distortions caused by the sampling means are suppressed. Two sampling means 20.1, 20.2 produce a delta voltage comprising six steps of equal height. The other two sampling means 20.3, 20.4 produce the identical signal shifted through 180°. The four means 20.1, 20.2, 20.3, 20.4 are driven via the clock generation means 25 at the same frequency, but using four clock signals with different phase angles. Summing the four output signals according to the correct arithmetical sign produces a delta voltage having four respective interpolation points per step, i.e. the delta voltage is now generated from 24 steps. The signal illustrated inside the means 30 for summing the output signals is shown reduced by a factor of 4, in order to allow better comparison. FIG. 1 clearly shows that the resolution has been raised by a factor of 4 without increasing the resolution of the individual sampling system and without increasing the sampling rate.

In general, the uninverted and inverted signals relate to the input signals and the resultant output signals of the sampling means. The summation of the uninverted signals and subtraction of the inverted signals relate to the output signals from the sampling systems. Thus, to produce additional inverted signals using digital/analog converters, only the digital input word for the respective converter would need to be inverted.

If only two sampling means are connected in parallel, the sampling frequency would be shifted through 180° (360°: 2 sampling means). This is the simplest case. In this context, only the phase angle of the input signal and output signal of the sampling means determines whether summation or subtraction is carried out.

Figure 4:
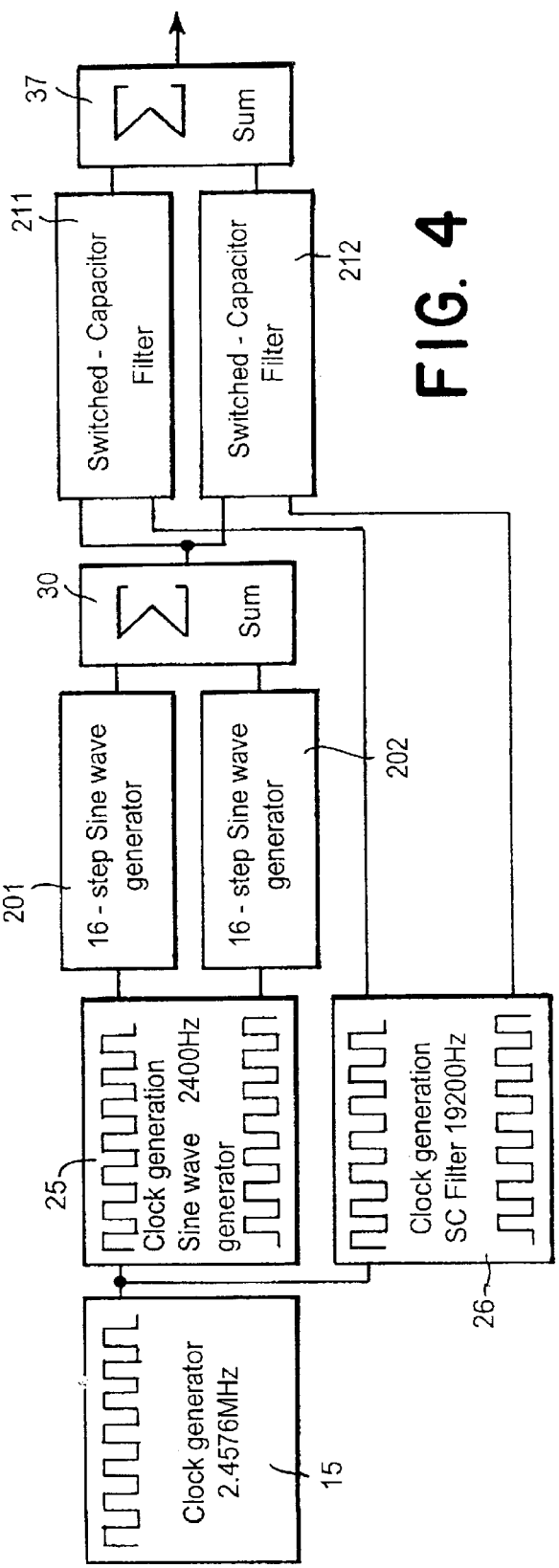
FIG. 4 shows a schematic block diagram of an apparatus having two digital sine wave generators and two switched capacitor filters.

A further illustrative embodiment is the generation of sinusoidal oscillations. In contrast to the delta voltage, the steps have different heights. The changes are largest at the zero crossing of the sine wave. FIG. 4 shows the block diagram of one possible implementation of a digital sine wave generator.

The clock generator 15 produces a master clock signal from which all the other clock signals are derived.

Figure 5:
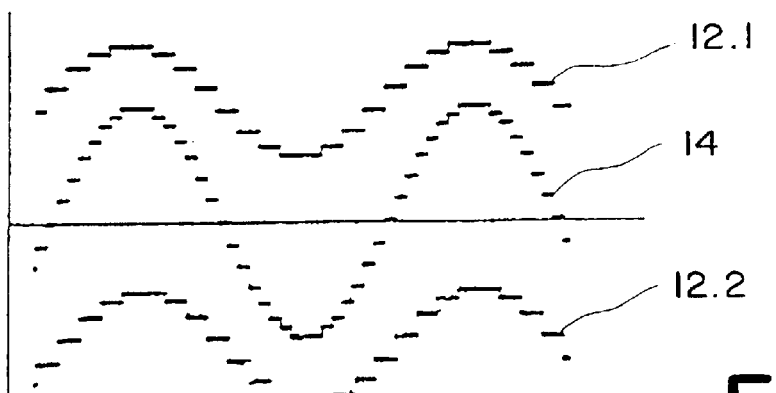
FIG. 5 shows a graph of the two 16-step sinusoidal oscillation generated in the apparatus shown in FIG. 4, and their summation to produce a 32-step sinusoidal oscillation.

The two digital sine wave generators 20.1, 20.2 comprise a known arrangement of known design. Both generator modules 20 are driven at the same frequency of 2400 Hz, but using clock signals shifted through 180°. Accordingly, the resultant sine wave frequency has a frequency of 2400 Hz/16=150 Hz. The two output amplitudes are summed in the summation stage downstream. FIG. 5 shows the corresponding oscillograms. The two 16-step sinusoidal oscillations 12.1, 12.2 are shifted by half a clock period relative to one another [sic]. In the center, the sinusoidal oscillation 14 is illustrated as the summation of the two signals. It is clearly evident that the summed signal 14 has twice the amplitude and twice as many discrete points. The different height of the steps has been retained in the same way.

Figure 6:
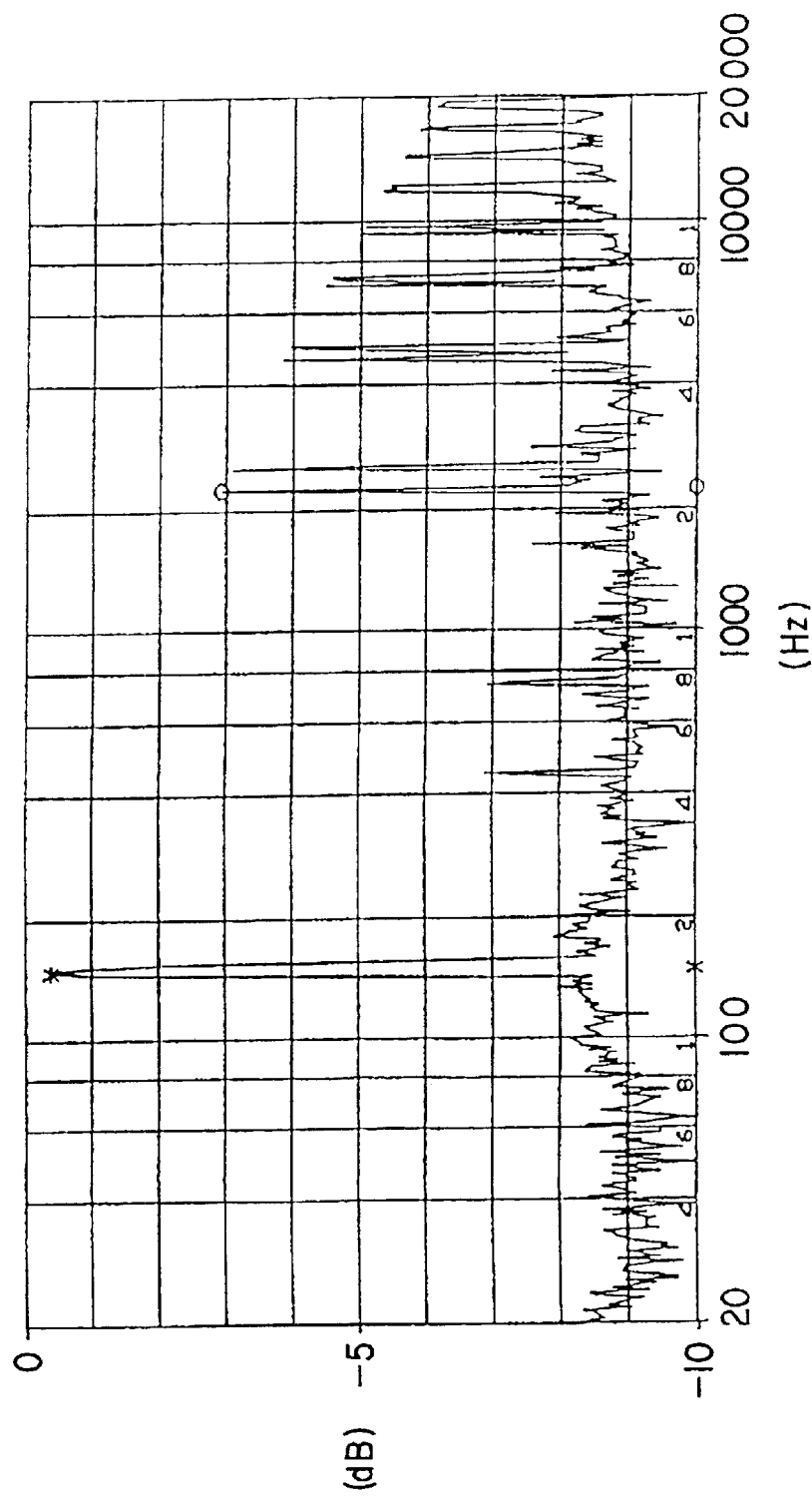
FIG. 6 shows a spectral analysis of the 16-step sinusoidal oscillation shown in FIG. 5.

FIG. 6 shows the spectral analysis of the 16-step sinusoidal oscillation 12.1. The dominant spectral components are the fundamental at a selected 150 Hz and the convolution products of the fundamental at the unsuppressed sampling frequency (sampling frequency–fundamental, sampling frequency+fundamental). These products are 25 dB below the fundamental, which is equivalent to approximately 20 log (1/16 bit)=–24 dB.

Figure 7:
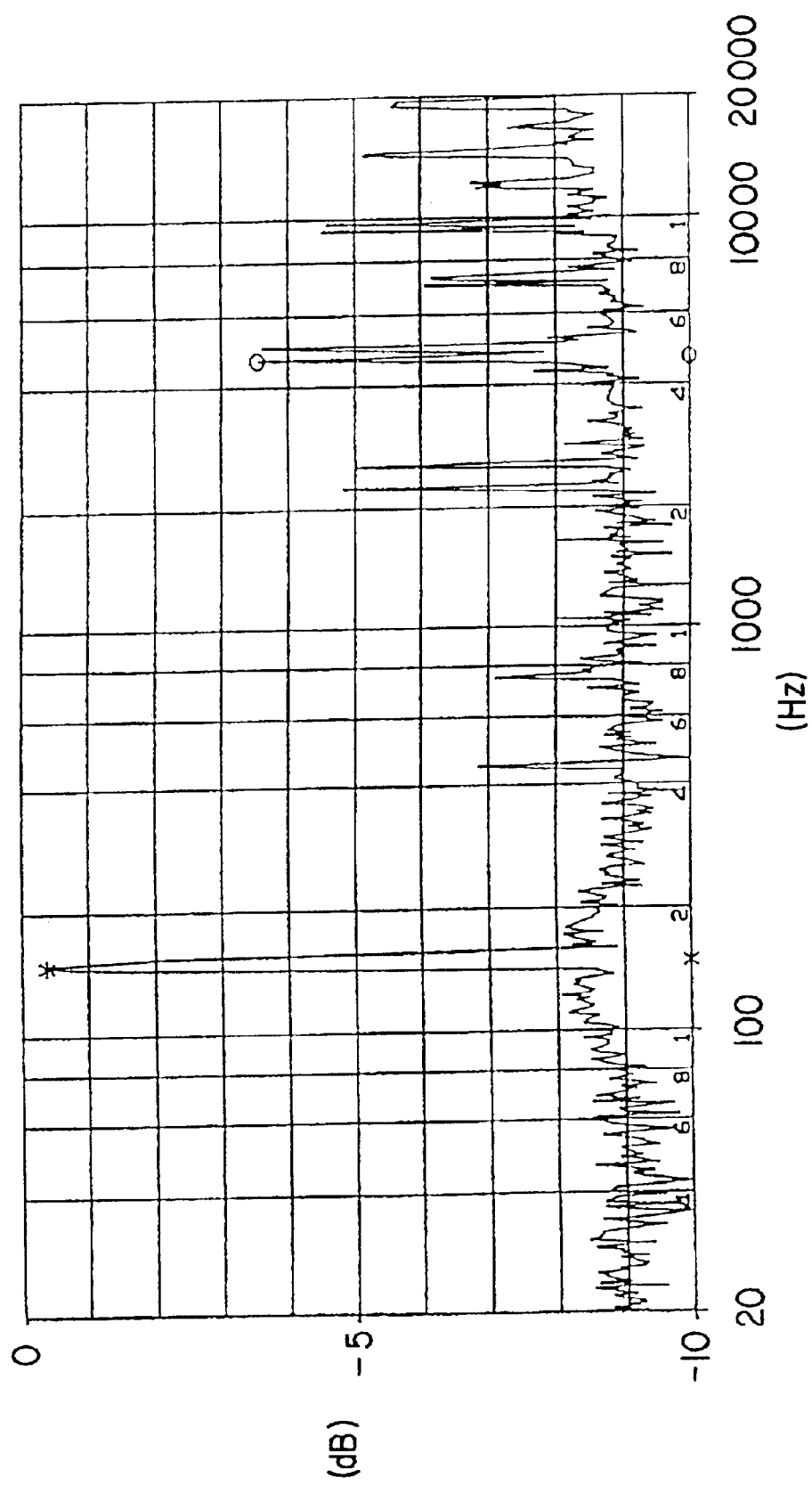
FIG. 7 shows a spectral analysis of the 32-step sinusoidal oscillation shown in FIG. 5.

FIG. 7 shows the spectral analysis of the 32-step summation of the sinusoidal oscillation 14. In the curve illustrated, the dominant spectral components are likewise the fundamental and the convolution products of the fundamental at the unsuppressed sampling frequency (sampling frequency–fundamental, sampling frequency+fundamental). The difference is that the dominant sampling frequency is twice the frequency as compared with the spectral analysis shown in FIG. 6, and that the amplitude is lower by half, that is to say 6 dB. This is equivalent to approximately 20 log (1/32 bit)=–30 dB. The additional mirror products are produced because the sampling frequency has not been suppressed.

Figure 8:
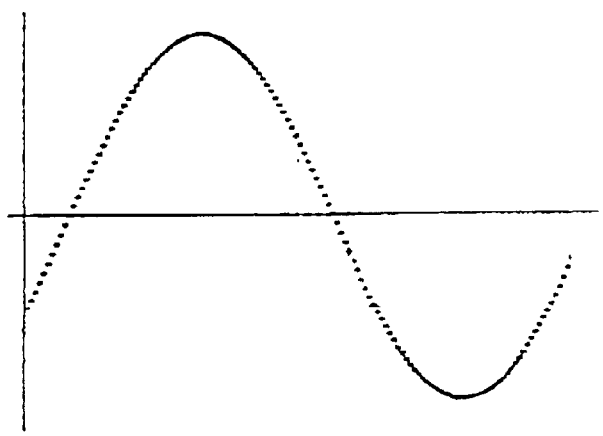
FIG. 8 shows a sinusoidal oscillation when a switched capacitor filter is additionally used.
Figure 9:
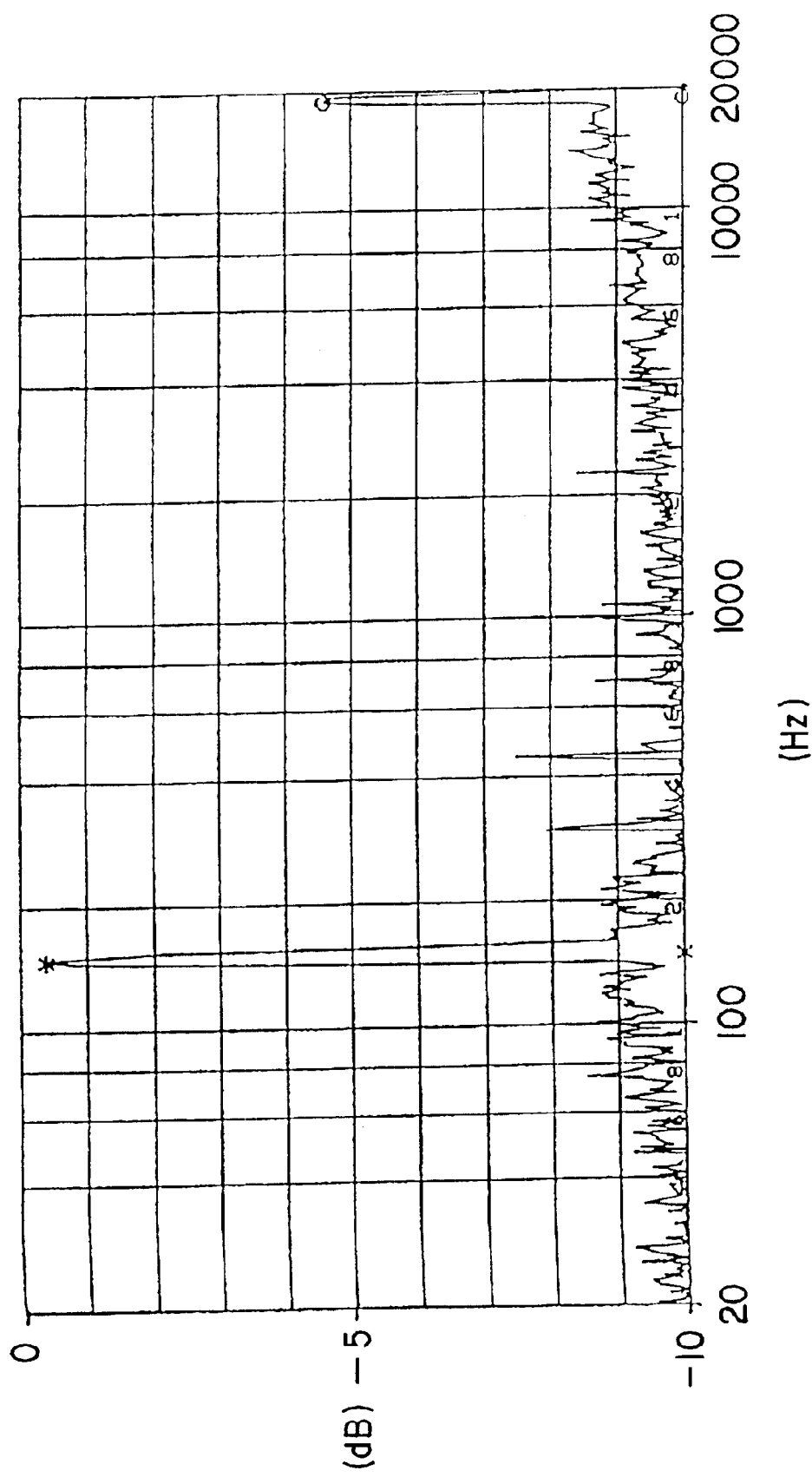
FIG. 9 shows a spectral analysis graph of the sinusoidal oscillation shown in FIG. 8.

The signals for the sinusoidal oscillation 14 shown in FIG. 5 are supplied to two switched capacitor filters 21.1, 21.2 whose cutoff frequency is placed such that they suppress these mirror products. The two filters 21.1, 21.2 are operated at a frequency of 19.2 kHz, which means that a resultant 3 dB cutoff frequency of 19200/100=192 Hz is produced on account of the specified values selected in this case. In the same way as for the generator, the two clock signals are shifted through 180° relative to one another and the two output signals are summed in summing means 31. FIG. 8 shows the signal when only one SC low-pass filter 21.1 is used. There are more gradations on account of the higher sampling rate, namely 19200/150=128. The spectral analysis of this signal is shown in FIG. 9. Besides the 150 Hz fundamental, the 19.2 kHz sampling frequency can also be seen. This is 20 log (19200/150)=–42 dB lower than the fundamental.

Figure 10:
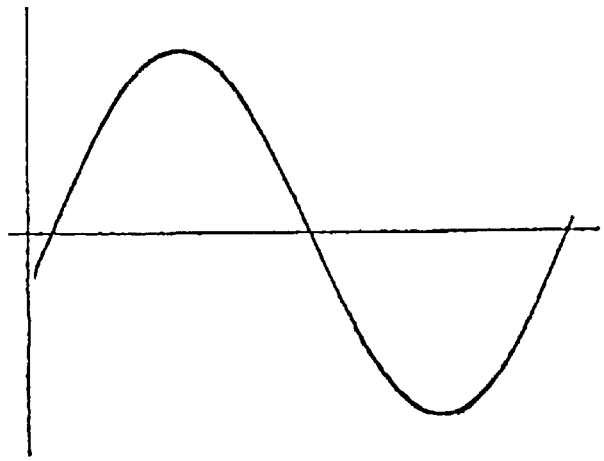
FIG. 10 shows a sinusoidal oscillation when two switched capacitor filters are additionally used.
Figure 11:
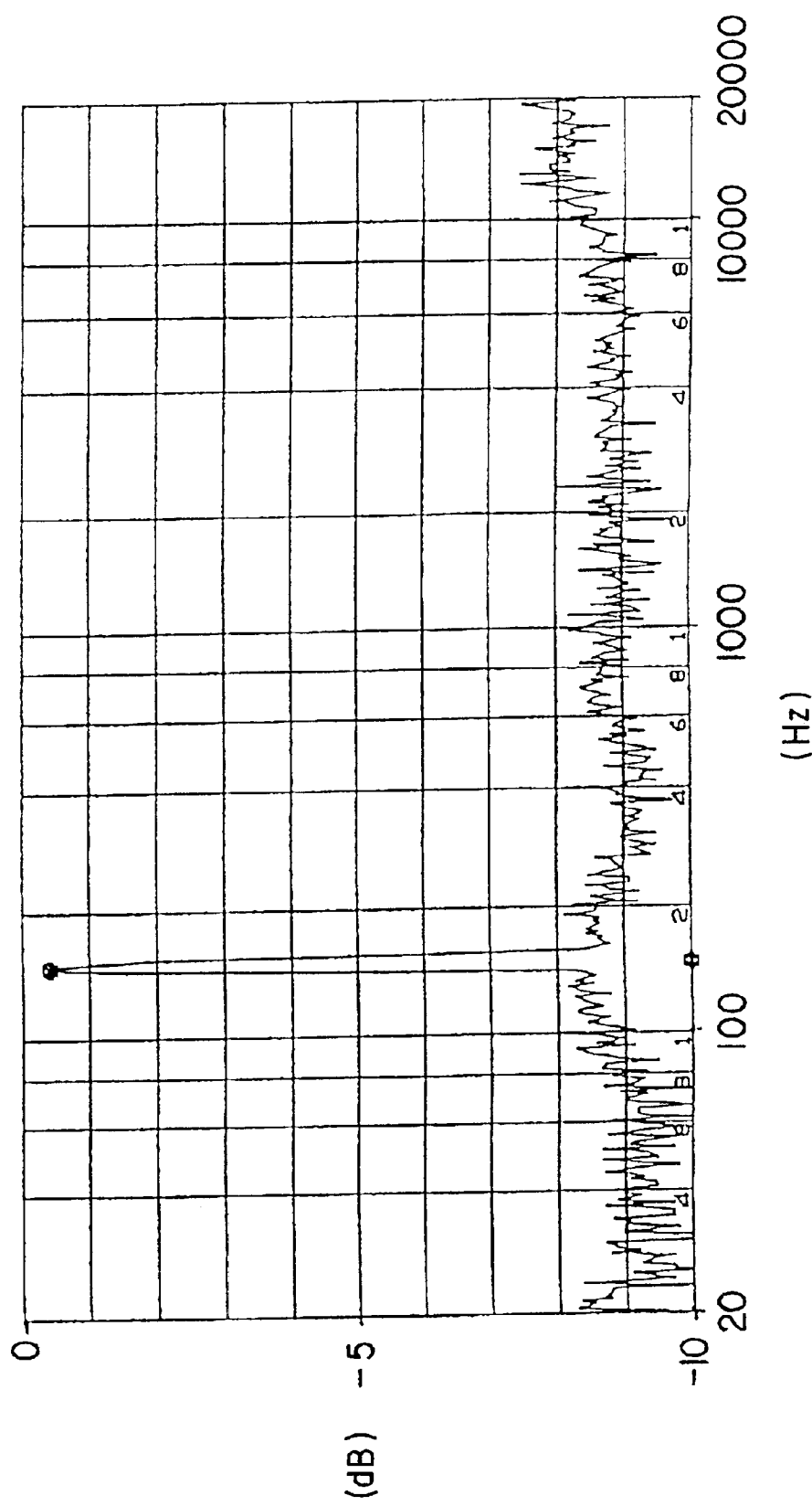
FIG. 11 shows a spectral analysis graph of the sinusoidal oscillation shown in FIG. 10, FIGS. 12A and 12B show a schematic illustration in detail form of an apparatus having ten parallel-connected switched capacitor filters with partially inverted input signals, FIGS. 12A and 12B being connected along the line A–A.

When both filters 21.1, 21.2 are used, the steps are doubled, as illustrated in FIG. 10. The spectral analysis of this signal is illustrated in FIG. 11. In this figure, only the fundamental can now be seen, since the spectral components of the sampling frequency is [sic] outside the audio band of 20 kHz, namely at 38.4 kHz with an amplitude of 20 log (38400/150)=–48 dB.

It is thus evident from this arrangement that each additional means connected in parallel in this manner affords an intermediate value, i.e. two parallel-connected means driven using a clock signal shifted 0° and using a clock signal shifted through 180° at the same frequency produce a frequency component whose frequency is higher by a factor of 2, and whose amplitude is lower by a factor of 2, than the original frequency component.

Figure 12A:
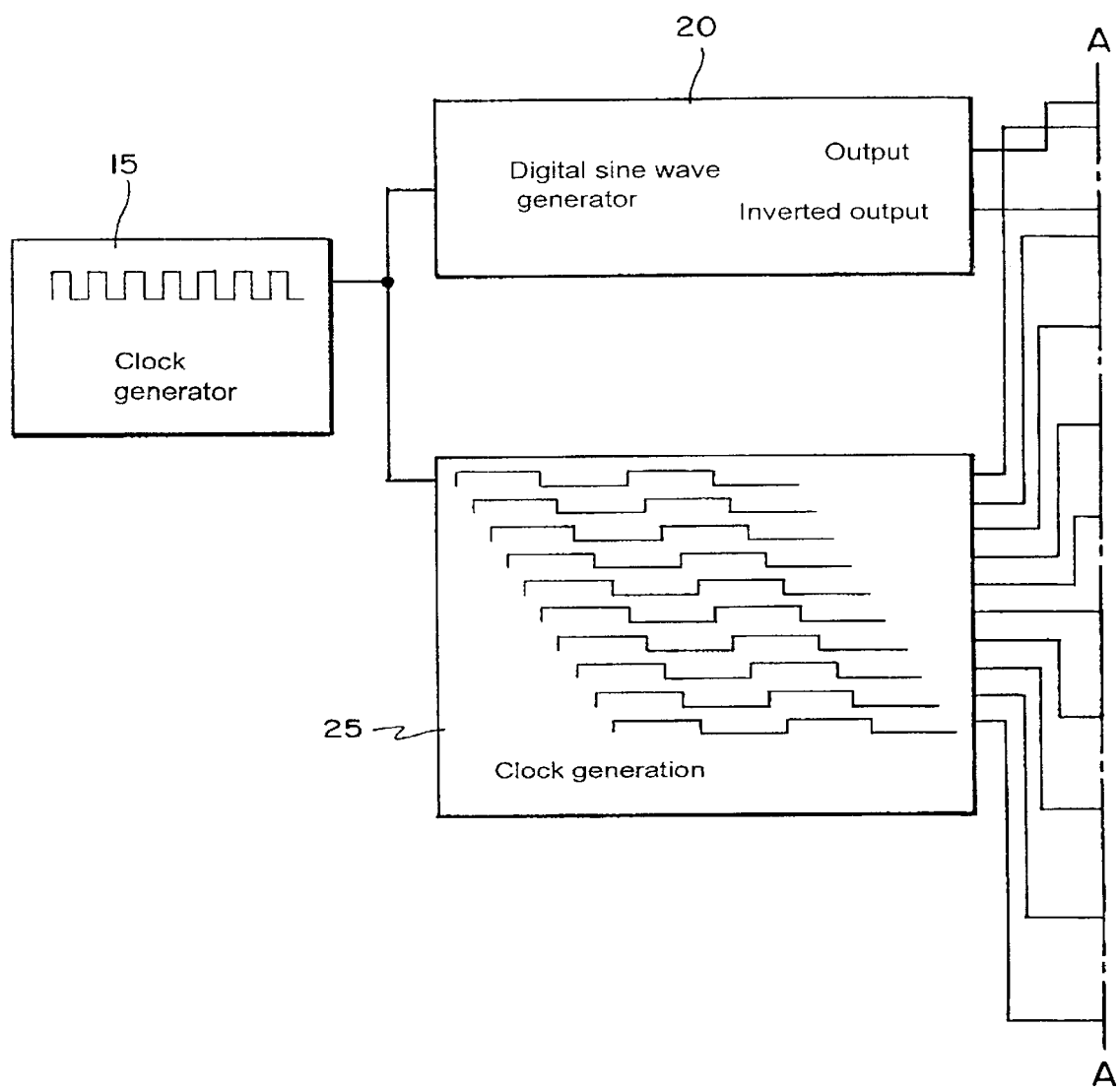
Figure 12B:
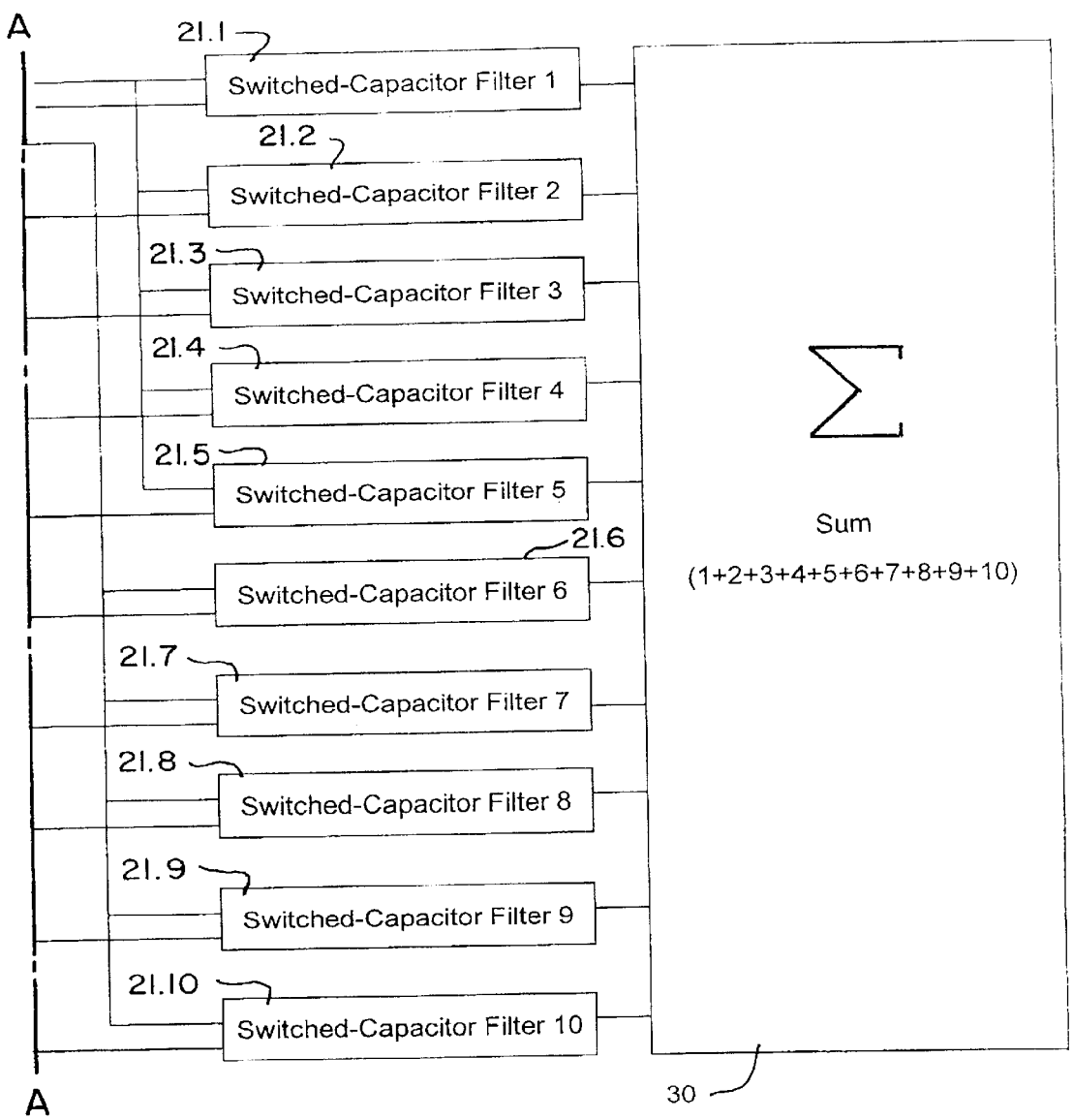

In order to produce filtering over the whole audio range using SC filters, without switching over the cutoff frequency of the analogously time-continuous filter downstream, the resultant spectral component needs to be outside the 20 kHz. This can be achieved by connecting ten SC filters in parallel, assuming that the 3 dB cutoff frequency is lower by a factor of 100 than the sampling frequency. The ten clock signals for the filters are then each shifted through 36°. FIG. 12 shows such an arrangement. This arrangement has two groups of five SC filters 21.1 to 21.10 each. The groups have input signals shifted through 180° applied to them (output and inverted output of the digital sine wave generator 20), which means that the distortions produced in the two groups are additionally eliminated upon summation according to the correct arithmetical sign.

The most important part is the provision of the clock signal for the SC filters 21.1 to 21.10. As is evident from the illustration of the clock generation means 25, all the clock signals have the same frequency but a different phase angle relative to one another.

The worst case is the generation of the 20 Hz sine wave signal, since the spectral component of the sampling frequency is then closest to the upper audio band. Assuming that the cutoff frequency of the SC low-pass filter is at 1.28 times the frequency based on the fundamental to be filtered in the present illustrative embodiment, the result is a sampling component of 20 Hz×1, 28×10×100=25.6 kHz with an amplitude of 20 log (20×1, 28×100×10/20)=–62 dB. The frequency of this spectral component is thus higher by a factor of 10, and the amplitude of this spectral component is lower by a factor of 10 (–20 db), than the component associated with each individual SC filter. Such a component is easily suppressed by a downstream time-continuous filter, the design of which is known.

As illustrated, the system can operate at fixed frequencies, for example at 44.1 kHz for the CD domain, at 48 kHz for the tape domain or at 13.5 MHz for the video domain, since the above figures relate to digital audio systems by way of example.

The apparatus according to the invention can likewise also be used at variable frequencies, however, such as occur in the case of tunable SC filters.

A further advantage produced by connecting the sampling means in parallel is the reduction in noise, because, whereas the output amplitude of the useful signal is doubled, the noise voltage in noncorrelating systems is increased only by the square root of 2.

What is claimed is:

1. An apparatus for signal processing discrete-time values for signal-sampling systems having means which deliver an analog-discrete-time output signal, the apparatus comprising:

means for producing discrete-time values, which are supplied to the means delivering the analog discrete-time output signal;

at least one group of at least two parallel-connected signal-sampling means;

means for producing sampling signals at the same frequency;

summation means which sum the output signals from the signal-sampling means, wherein in the at least one group of at least two signal-sampling parallel-connected means, signal sampling is in each case carried out on the input signal, which is identical in terms of magnitude and the respective sampling means is driven by the means for producing sampling signals at the same frequency using a shifted phase angle for the sampling signals, resulting in that for each input signal, a plurality of analog output signals are produced which are identical but phase-shifted on the basis of the number of parallel-connected signal-sampling means, the summation of said output signals representing interpolation exclusively in the analog domain.

2. Apparatus according to claim 1, wherein the number of parallel-connected sampling systems is equivalent to the number of sampling signals at the same frequency with a shifted phase angle.

3. Apparatus according to claim 1, wherein n sampling signals each phase-shifted through 360°/n are produced, where n corresponds to the number of parallel-connected sampling means so that linear interpolation is possible.

4. Apparatus according to claim 1, wherein, in the case of sampling signals at the same frequency, the phase differences of the sampling signals with a shifted phase angle are different, so that nonlinear interpolation is possible.

5. Apparatus according to claim 1, wherein, in the case of sampling signals at the same frequency, the parallel-connected sampling means are driven using sampling signals with a shifted phase angle and have uninverted and inverted input signals applied to them, and the means for summing the signals sum the uninverted signals deduct the inverted signals.

6. Apparatus according to claim 1, wherein, in the case of sampling signals at the same frequency, the number of sampling signals produced with a shifted phase angle is equivalent to the number of interpolation points.

7. Apparatus according to claim 1, wherein at least two sampling means are identical.

8. Apparatus according to claim 1, including a plurality of groups of means which are to be sampled are provided, each group being driven using different sampling signals with a shifted phase angle.

9. Apparatus according to claim 8, wherein the signals from the plurality of groups of sampling means are supplied to a summing means.

10. Apparatus according to claim 8, wherein the summed signals from the first group of sampling means are supplied to a second group of sampling means, which , in turn, are driven via further means for producing sampling signals, in the case of sampling signals at the same frequency, using sampling frequencies with a shifted phase angle and whose signals are supplied to further summing means.

11. Apparatus according to claim 1, including a plurality of groups of means which are to be sampled are provided, each group being driven using identical sampling signals with a shifted phase angle.

* * * * *